(12) United States Patent
Chern et al.

(10) Patent No.: US 9,793,389 B1
(45) Date of Patent: Oct. 17, 2017

(54) APPARATUS AND METHOD OF FABRICATION FOR GAN/SI TRANSISTORS ISOLATION

(71) Applicant: Taiwan Semiconductor Manufacturing Company Limited, Hsinchu (TW)

(72) Inventors: Chan-Hong Chern, Palo Alto, CA (US); Chun-Lin Tsai, Hsin-Chu (TW); Mark Chen, Hsinchu County (TW); King-Yuen Wong, Hong Kong (HK)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 15/182,667

(22) Filed: Jun. 15, 2016

(51) Int. Cl.
| | |
|---|---|
| *H01L 21/768* | (2006.01) |
| *H01L 29/778* | (2006.01) |
| *H01L 27/12* | (2006.01) |
| *H01L 29/20* | (2006.01) |
| *H01L 29/205* | (2006.01) |
| *H01L 29/66* | (2006.01) |
| *H01L 23/535* | (2006.01) |

(52) U.S. Cl.
CPC ...... *H01L 29/7787* (2013.01); *H01L 21/7684* (2013.01); *H01L 21/76895* (2013.01); *H01L 23/535* (2013.01); *H01L 27/1203* (2013.01); *H01L 29/2003* (2013.01); *H01L 29/205* (2013.01); *H01L 29/66462* (2013.01)

(58) Field of Classification Search
CPC ............. H01L 29/7787; H01L 21/7684; H01L 21/76895; H01L 23/535; H01L 27/1203; H01L 29/2003; H01L 29/205; H01L 29/66462

USPC .......................................................... 257/76
See application file for complete search history.

(56) References Cited

U.S. PATENT DOCUMENTS

| | | | |
|---|---|---|---|
| 2008/0048196 A1* | 2/2008 | Strittmatter ............ | B82Y 20/00 257/94 |
| 2012/0156836 A1* | 6/2012 | Shealy .............. | H01L 21/02145 438/172 |
| 2014/0077217 A1* | 3/2014 | Saito ....................... | H01L 24/06 257/76 |

OTHER PUBLICATIONS

Min et al. ("Effective Body Contact in SOI Devices by Partial Trench Isolated Body-tied (PRIBT) Structure," Proceedings International Semiconductor Device Research Symposium, pp. 469-472, Dec. 5-7, 2001).*

(Continued)

*Primary Examiner* — Yasser A Abdelaziez
(74) *Attorney, Agent, or Firm* — Jones Day

(57) ABSTRACT

In one embodiment, a method of fabricating a semiconductor device having an isolated first transistor circuit and an isolated second transistor circuit is provided. The method comprises providing a silicon on insulator (SOI) wafer and fabricating an isolated first silicon region and an isolated second silicon region on the SOI wafer wherein each of the first silicon region and the second silicon region is bounded on its sides by a trench filled with insulator material. The method further comprises fabricating an active area comprising GaN on each of the first silicon region and the second silicon region to form the first transistor circuit and the second transistor circuit and fabricating source, drain, gate, and body connections for each of the first transistor circuit and the second transistor circuit.

19 Claims, 19 Drawing Sheets

(56) References Cited

OTHER PUBLICATIONS

Stolichnov et al. ("Ferroelectric gate for control of transport properties of two-dimensional electron gas at heterostructures," Appl. Physics Lett. 88, 043512-1:043512-3, 2006).*

Wang et al. ("Epitaxial growth of lead zirconium titanate thin films on Ag buffered Si substrates using rf sputtering," Appl. Physics Lett. 90, 172903-1:172903-3, 2007).*

* cited by examiner

APPARATUS AND METHOD OF FABRICATION FOR GAN/SI TRANSISTORS ISOLATION

BACKGROUND

The technology described in this patent document relates generally to integrated circuit substrate isolation and more particularly to an integrated circuit substrate isolation scheme for reducing substrate coupling issues.

Scaling of semiconductor devices, such as a metal-oxide semiconductor field-effect transistor (MOSFET), has enabled continued improvement in speed, performance, density, and cost per unit function of integrated circuits over the past few decades. Improvements to integrating transistors that operate in different power domains can further the scaling of integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
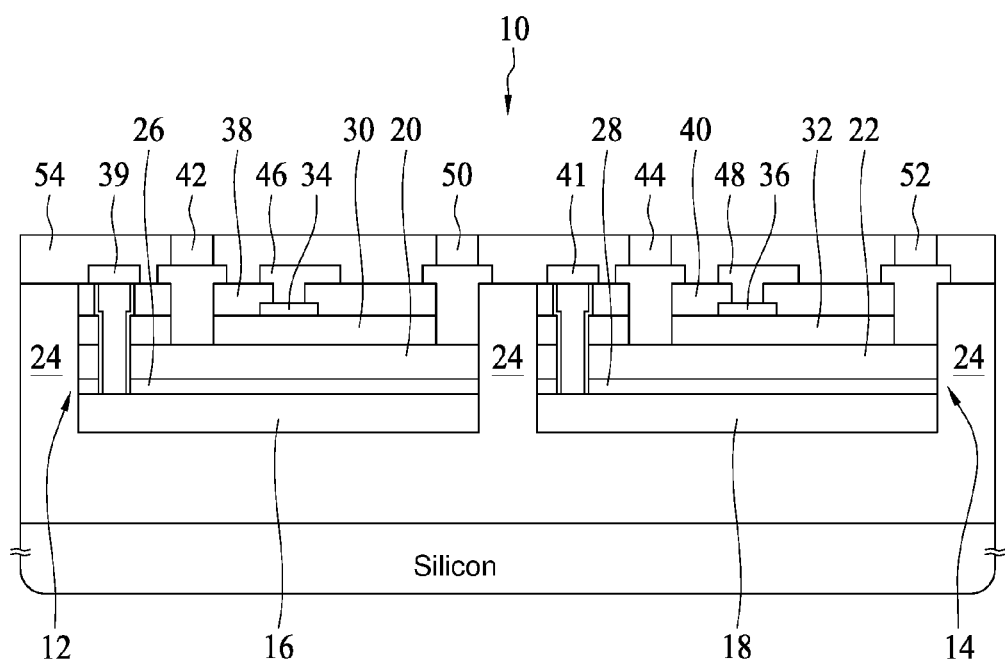
FIG. 1 is a block diagram of an example semiconductor device that is fabricated on a silicon on insulator (SOI) wafer and that achieves isolation of GaN/Si transistors, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Gallium nitride on silicon (GaN/Si) high electron mobility transistors (HEMTs) can provide advantages over silicon (Si) based transistors in high power, high frequency, high temperature applications and therefore are well-suited for power conversion, radio frequency (RF) power amplification (PA)/switch applications. When GaN/Si HEMTs are integrated together on a common substrate with both source and sink circuits or circuits in different power domains, substrate coupling however may occur. Substrate coupling can degrade transistor performance and result in circuit malfunction if the voltage difference between the GaN/Si substrate and source exceeds a certain threshold due to depletion of the 2-dimensional electron gas (2DEG). A method of preventing substrate coupling and attaining viable GaN/Si integrated circuits is to isolate transistors and circuits in different power domains.

One way of achieving isolation is to separately bond discrete GaN/Si transistors onto a PCB or a package substrate. Doing so however may result in decreased performance due to parasitic inductance, resistance, and capacitance since bonding results in farther distances between transistors as compared to transistors grown on the same wafer. Separately bonding discrete GaN/Si transistors onto a substrate may also make the GaN transistors vulnerable to reliability concerns due to increased inductance especially in ultra-high-voltage power converter applications. Also, other components on the substrate may have their high frequency operation limited due to the parasitic inductance, resistance, and capacitance and ultra-high-voltage requirement such as in power conversion applications.

FIG. 1 is a block diagram of an example semiconductor device 10 that is fabricated on a silicon on insulator (SOI) wafer and that achieves isolation of GaN/Si transistors that are in different power domains. The example semiconductor device 10 achieves transistor and circuit isolation through selective epitaxial growth and without separately bonding discrete GaN/Si transistors onto a printed circuit board (PCB) or a package substrate. The example semiconductor device 10 includes a first transistor 12 and a second transistor 14, which are isolated from each other. The first transistor 12 is fabricated on an isolated first silicon region 16 and the second transistor 14 is fabricated on an isolated second silicon region 18. Each of the first transistor 12 and the second transistor 14 includes an active region comprising GaN material 20, 22 above its respective isolated silicon region 16, 18. Each of the isolated silicon regions 16, 18 is formed from the silicon above the insulator on the SOI wafer.

The isolated silicon regions 16, 18 and the active regions of the first and second transistors 12, 14 are bounded by insulator material 24. The first silicon region 16 and the first transistor circuit 12 are isolated from the second silicon region 18 and the second transistor circuit 14 by the insulator material 24. In this example, the insulator material 24 is formed from either the same material as the insulator in the SOI wafer such as silicon dioxide ($SiO_2$) or some other type of dielectric. Although $SiO_2$ is illustrated, other types of insulators could be used such as SiO, $Si_3N_4$, AlN, and MgO. The insulator material that bounds the active areas and the isolated silicon regions 16, 18 may be positioned through forming a trench and filling the trench with the insulator material.

In this example, the active regions of each of the first transistor circuit 12 and the second transistor circuit 14 comprises its respective silicon layer 16, 18, a transition layer 26, 28 above the silicon layer 16, 18, a GaN layer 20, 22 above the transition layer 26, 28, an AlGaN (aluminum gallium nitride) layer 30, 32 above the GaN layer, silicon layer 16, 18, and a patterned polarization modulation layer 34, 36 above the AlGaN layer 30, 32.

In this example, the first and second transistors 12, 14 further include a passivation layer 38, 40 above the active areas, a body contact connection point 39, 41, a source connection point 42, 44, a gate connection point 46, 48 and a drain connection point 50, 52. The semiconductor device is further covered with inter-layer-dielectric (ILD) material 54. Also, in this example, each of the body contact connection points 39, 41 comprise a through-GaN-via (TGV) hole in the active region of the respective transistor circuit to the respective isolated silicon region 16, 18 that is filled with metal material forming a contact to the respective isolated silicon region.

Figure 2:
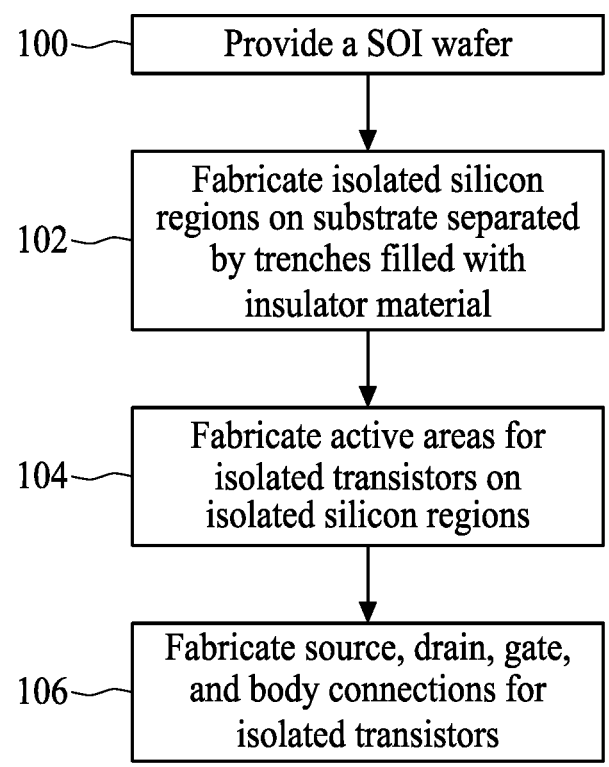
FIG. 2 is a process flow chart illustrating an example method of fabricating a semiconductor device that achieves isolation of GaN/Si transistors, in accordance with some embodiments.

FIG. 2 is a process flow chart illustrating an example method of fabricating a semiconductor device that achieves isolation of GaN/Si transistors. An SOI wafer is provided (operation 100). Isolated silicon regions separated by trenches filled with insulator material are fabricated on the SOI wafer (operation 102). Active areas for isolated transistors are fabricated on the isolated silicon regions (operation 104). Source, drain, gate, and body connections for the isolated transistors are then fabricated (operation 106).

Figure 3:
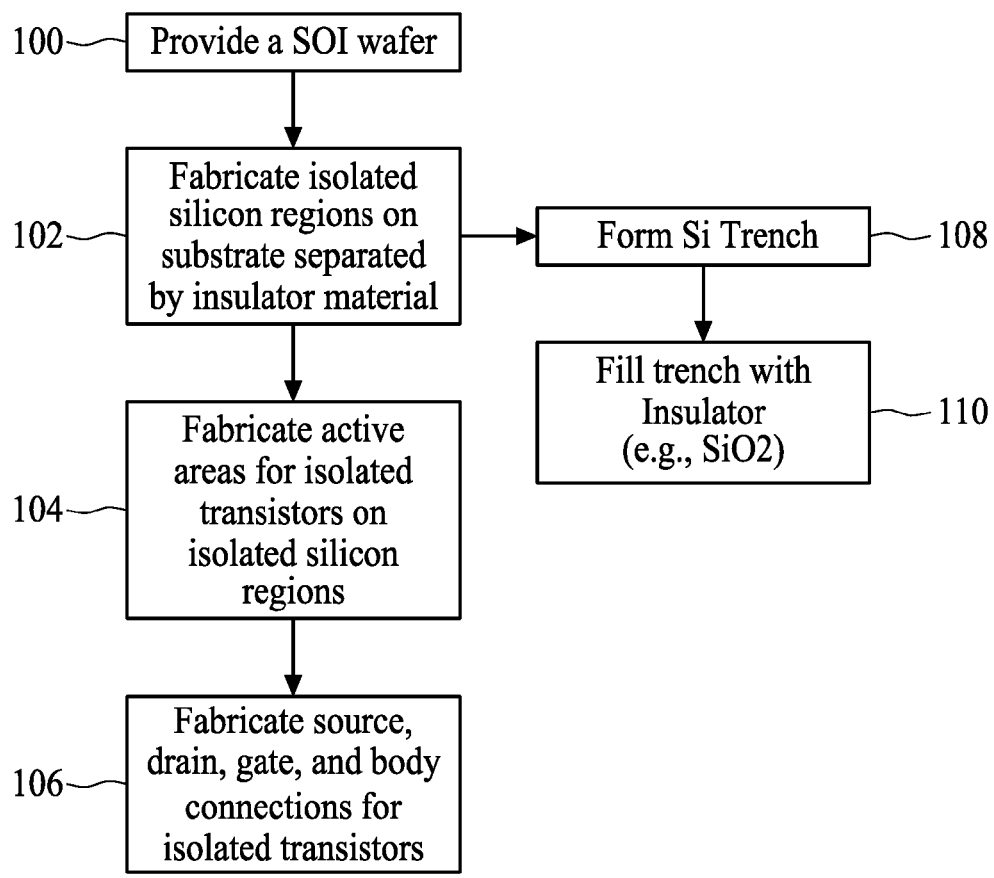
FIG. 3 is another process flow chart illustrating an example method of fabricating a semiconductor device that achieves isolation of GaN/Si transistors, in accordance with some embodiments.

FIG. 3 is another process flow chart illustrating an example method of fabricating a semiconductor device that achieves isolation of GaN/Si transistors. This example method includes similar operations as the example method of FIG. 2 and further illustrates that the fabrication of isolated silicon regions separated by trenches filled with insulator material may involve forming a Si trench (operation 108) and filling the trench with insulator material (operation 110).

Figure 4:
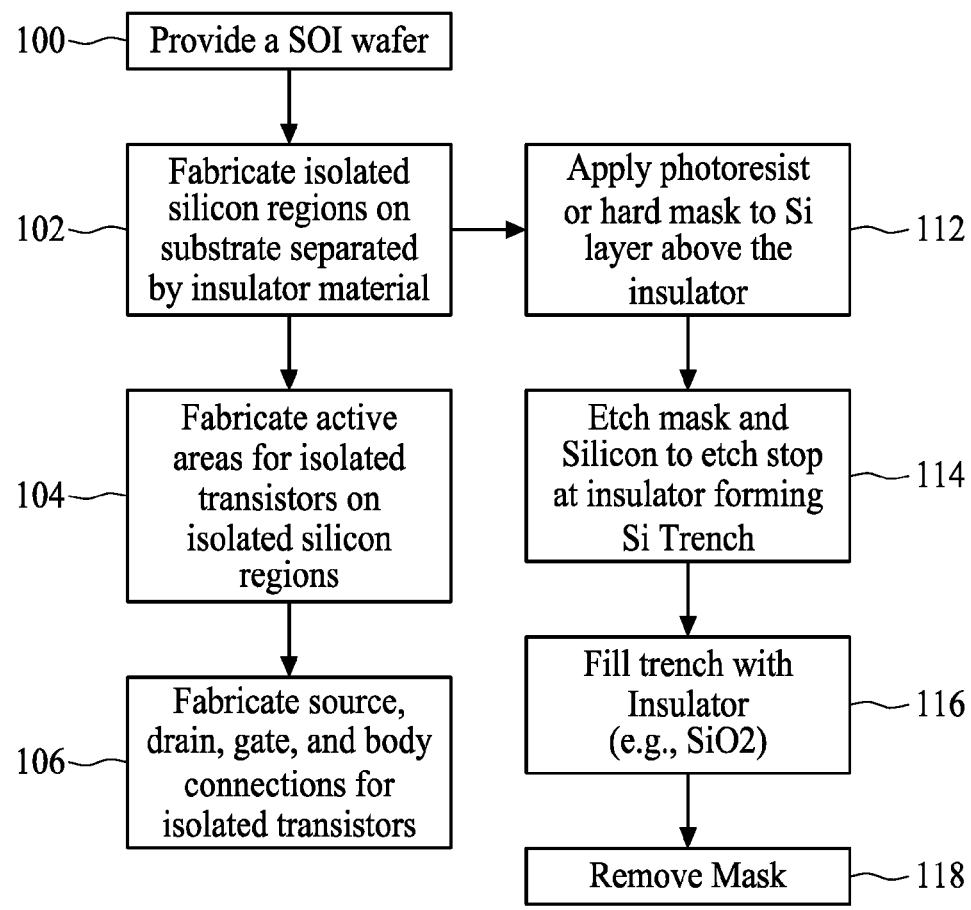
FIG. 4 is another process flow chart illustrating an example method of fabricating a semiconductor device that achieves isolation of GaN/Si transistors, in accordance with some embodiments.

FIG. 4 is another process flow chart illustrating an example method of fabricating a semiconductor device that achieves isolation of GaN/Si transistors. This example method includes similar operations as the example method of FIG. 2 and further illustrates operations that may be used to fabricate isolated silicon regions separated by trenches filled with insulator material on the SOI wafer.

Figure 5A:
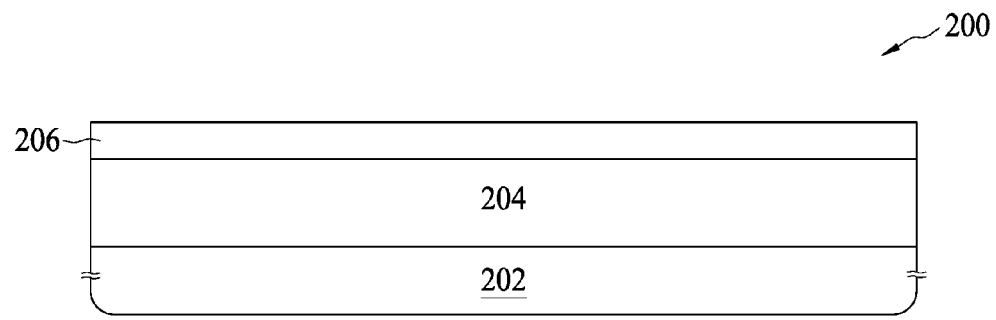
FIGS. 5A, 5B, 5C, 5D, and 5E provide cross-sectional views of an example semiconductor device during various stages of fabrication according to operations specified in FIG. 4, in accordance with some embodiments.

Specifically, an SOI wafer is provided (operation 100). FIG. 5A provides a cross-sectional view of an example SOI wafer 200. The example SOI wafer 200 includes a bottom silicon layer 202, an insulator 204 ($SiO_2$ or a dielectric in this illustration) above the silicon layer 202, and a second silicon layer 206 above the insulator 204.

Figure 5B:
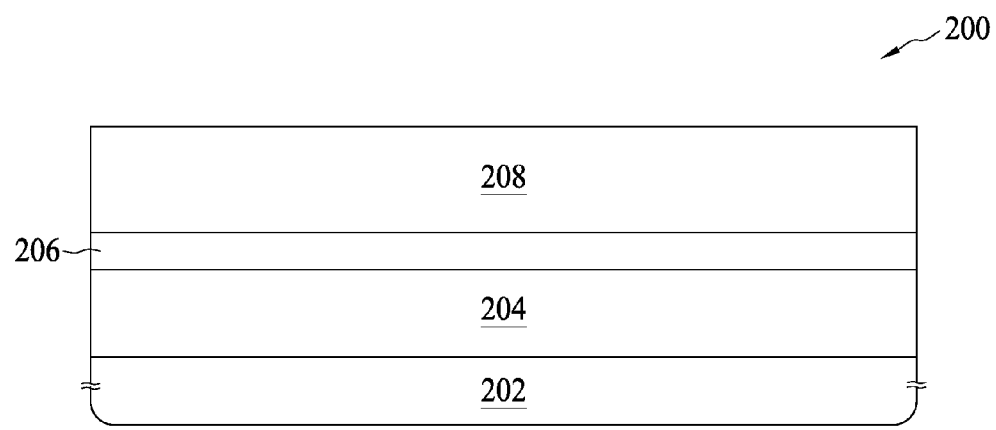

Referring back to FIG. 4, isolated silicon regions separated by trenches filled with insulator material are fabricated on the SOI wafer (operation 102). The fabrication of isolated silicon regions in this example method involves applying a mask such as photoresist or a hard mask to the Si layer above the insulator (operation 112). FIG. 5B provides a cross-sectional view of an example SOI wafer with a mask 208 applied to the Si layer 206 above the insulator 204.

Figure 5C:
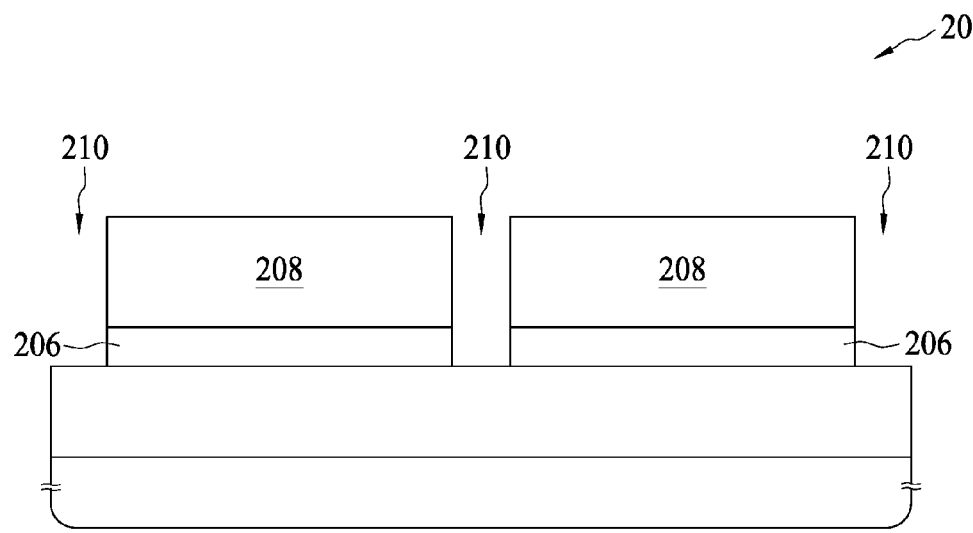

The mask and silicon are etched to an etch stop at the insulator forming a Si trench (operation 114). FIG. 5C provides a cross-sectional view of an example SOI wafer 200 with the mask 208 and silicon 206 etched to an etch stop at the insulator 204 forming a Si trench 210.

Figure 5D:
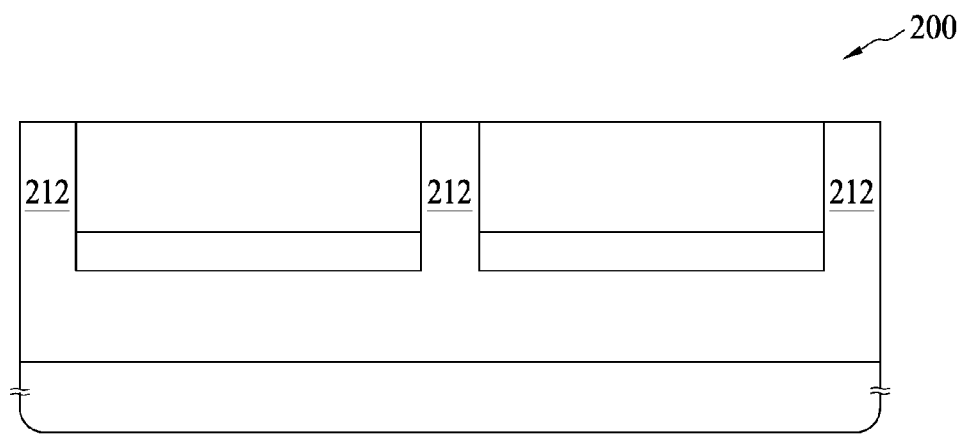

The Si trench is filled with an insulator (operation 116). FIG. 5D provides a cross-sectional view of an example SOI wafer with the Si trench filled with an insulator 212. In this example, the insulator material 212 is formed either from the same material as the insulator 204 in the SOI wafer such as $SiO_2$ or some other type of dielectric. Although $SiO_2$ is illustrated, other types of insulators could be used such as SiO, $Si_3N_4$, AlN, and MgO.

Figure 5E:
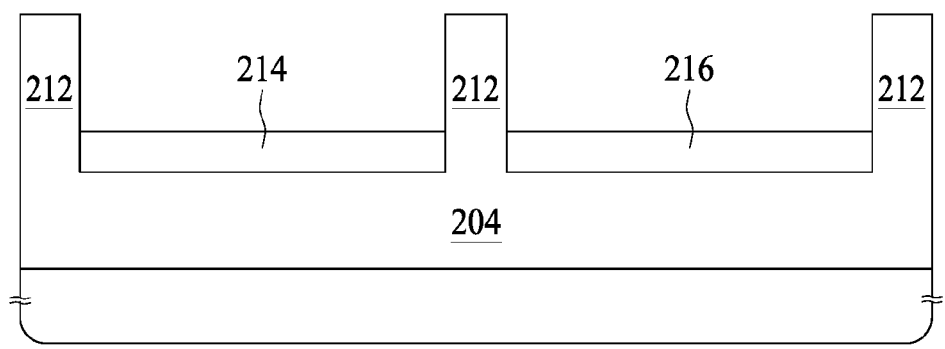

Referring back to FIG. 4, the mask is removed (operation 118) thereby providing isolated silicon regions on the substrate separated by insulator material. FIG. 5E provides a cross-sectional view of an example SOI wafer with the mask removed and isolated silicon regions 214, 216 on the substrate bounded by insulator material 204, 212.

Figure 6:
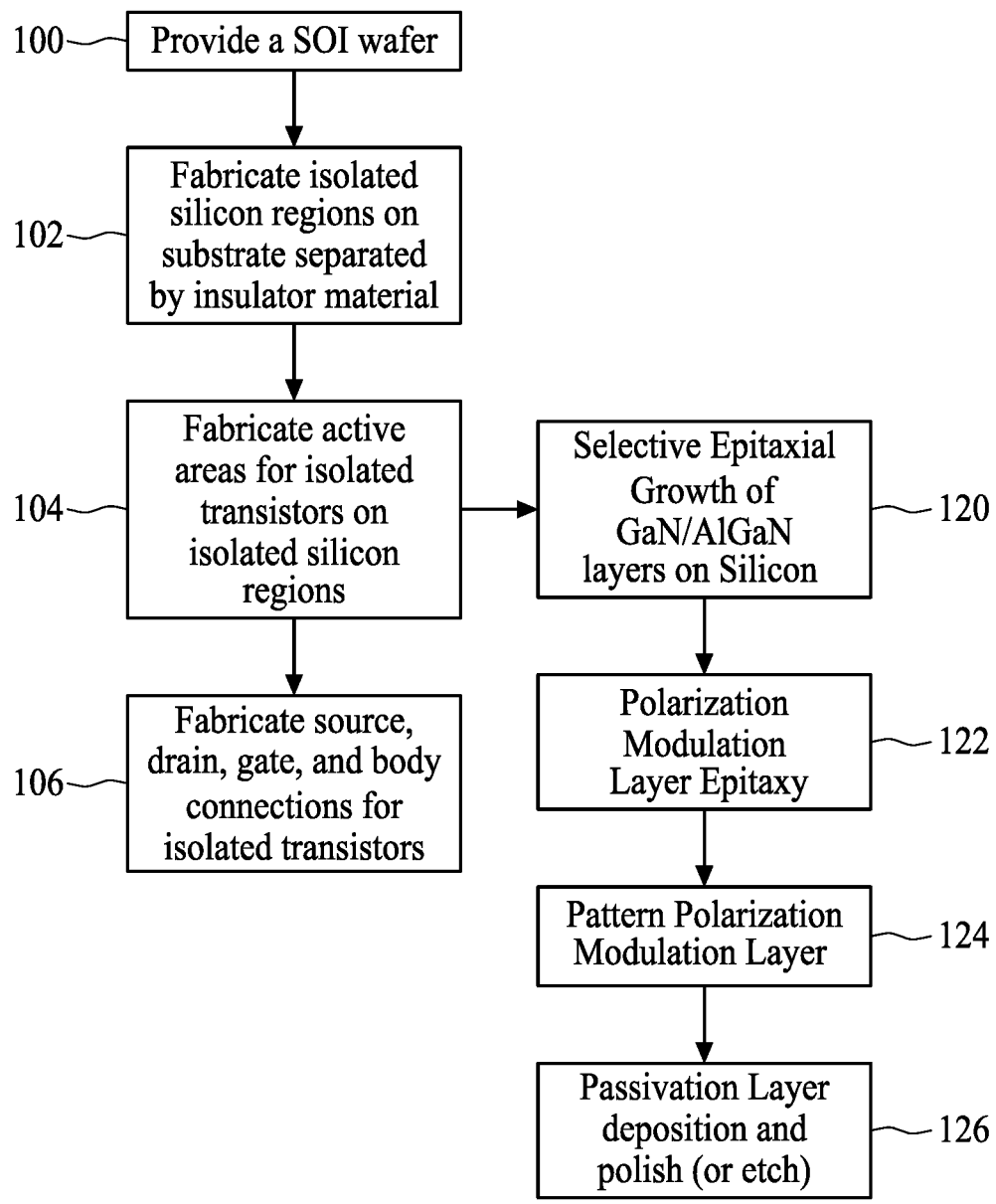
FIG. 6 is another process flow chart illustrating an example method of fabricating a semiconductor device that achieves isolation of GaN/Si transistors, in accordance with some embodiments.

FIG. 6 is another process flow chart illustrating an example method of fabricating a semiconductor device that achieves isolation of GaN/Si transistors. This example method includes similar operations as the example method of FIG. 2 and further illustrates operations that may be used to fabricate active areas for isolated transistors on isolated silicon regions.

Figure 7A:
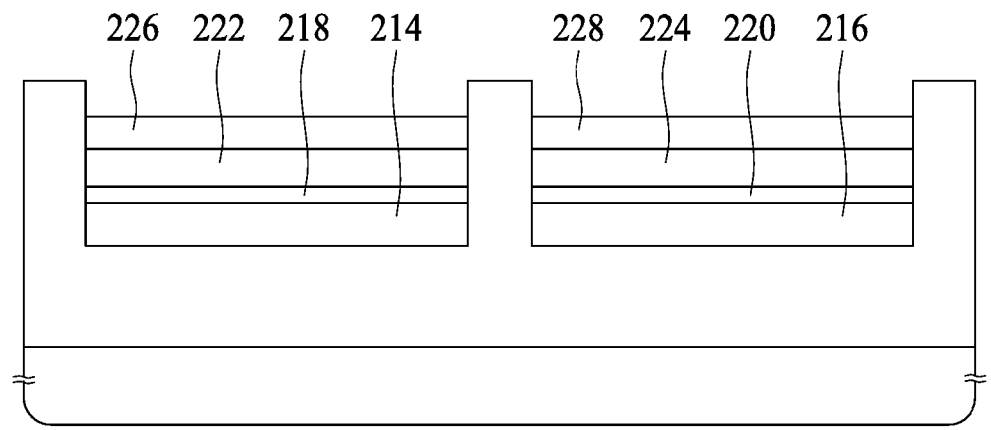
FIGS. 7A, 7B, 7C, and 7D provide cross-sectional views of an example semiconductor device during various stages of fabrication according to operations specified in FIG. 6, in accordance with some embodiments.

The fabrication of active areas for isolated transistors on isolated silicon regions (operation 104) in this example involves selective epitaxial growth of GaN/AlGaN layers on silicon (operation 120). FIG. 7A provides a cross-sectional view of an example SOI wafer after the selective epitaxial growth of GaN/AlGaN layers on silicon. In particular, shown are a transition layer 218, 220 over the silicon layers 214, 216, a GaN layer 222, 224 over the transition layer, and an AlGaN layer 226, 228 over the GaN layer.

Figure 7B:
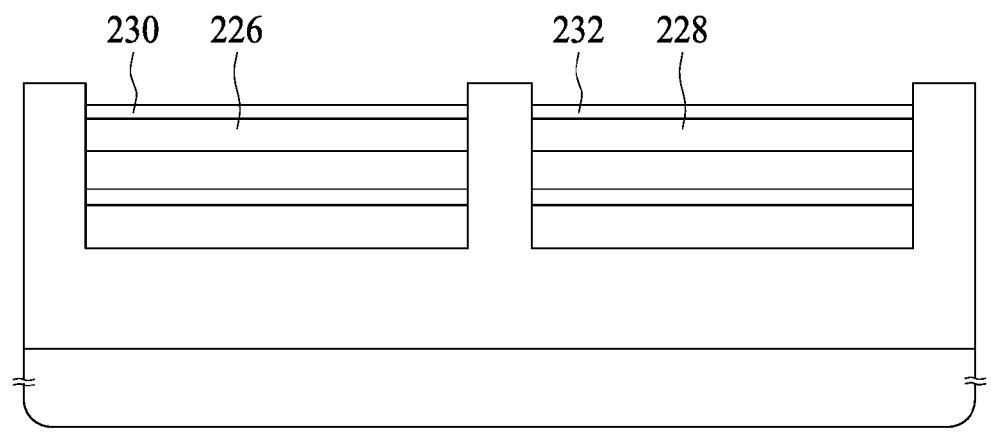

Referring back to FIG. 6, a polarization modulation layer is grown using epitaxial growth operations (operation 122). FIG. 7B provides a cross-sectional view of an example SOI wafer with a polarization modulation layer 230, 232 above an AlGaN layer 226, 228.

Figure 7C:
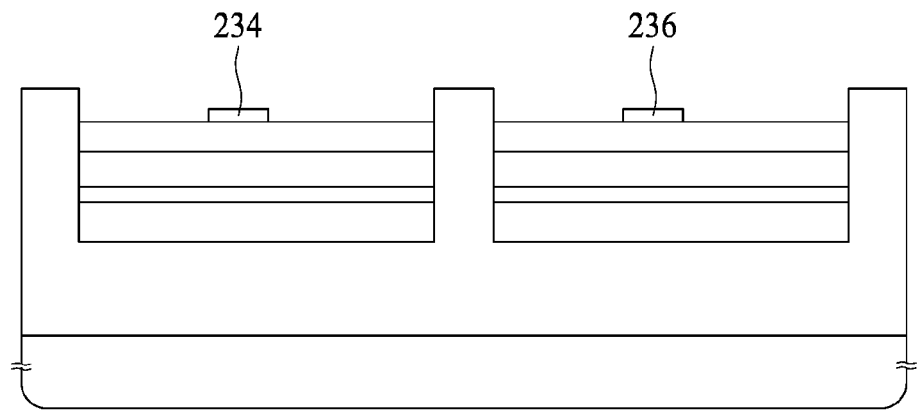

The polarization modulation layer is patterned for use with a transistor gate (operation 124). FIG. 7C provides a cross-sectional view of an example SOI wafer with a patterned polarization modulation layer 234, 236.

Figure 7D:
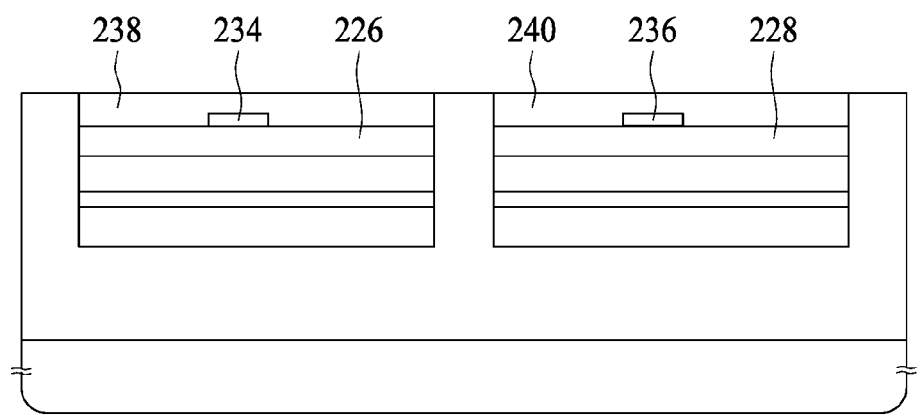

A passivation layer is provided through deposition and polish (or etch) operations (operation 126). FIG. 7D provides a cross-sectional view of an example SOI wafer with a passivation layer 238, 240 above an AlGaN layer 226, 228 and patterned polarization modulation layer 234, 236.

Figure 8:
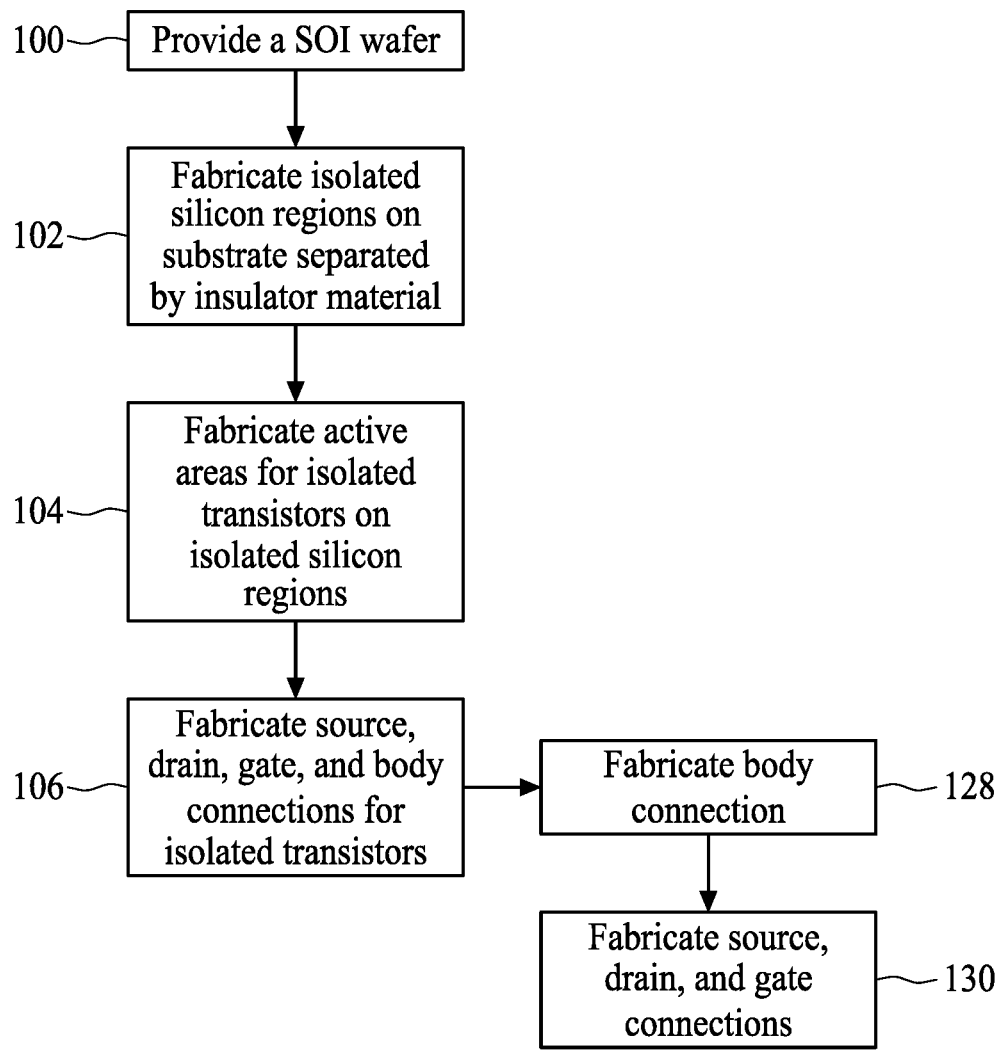
FIG. 8 is another process flow chart illustrating an example method of fabricating a semiconductor device that achieves isolation of GaN/Si transistors, in accordance with some embodiments.

FIG. 8 is another process flow chart illustrating an example method of fabricating a semiconductor device that achieves isolation of GaN/Si transistors. This example method includes similar operations as the example method of FIG. 2 and further illustrates that the fabrication of source, drain, gate, and body connections for isolated transistors (operation 106) may be performed in two stages. The body connection point may be fabricated in one stage (operation 128) and the source, drain, and gate connection points may be fabricated in another stage (operation 130).

Figure 9:
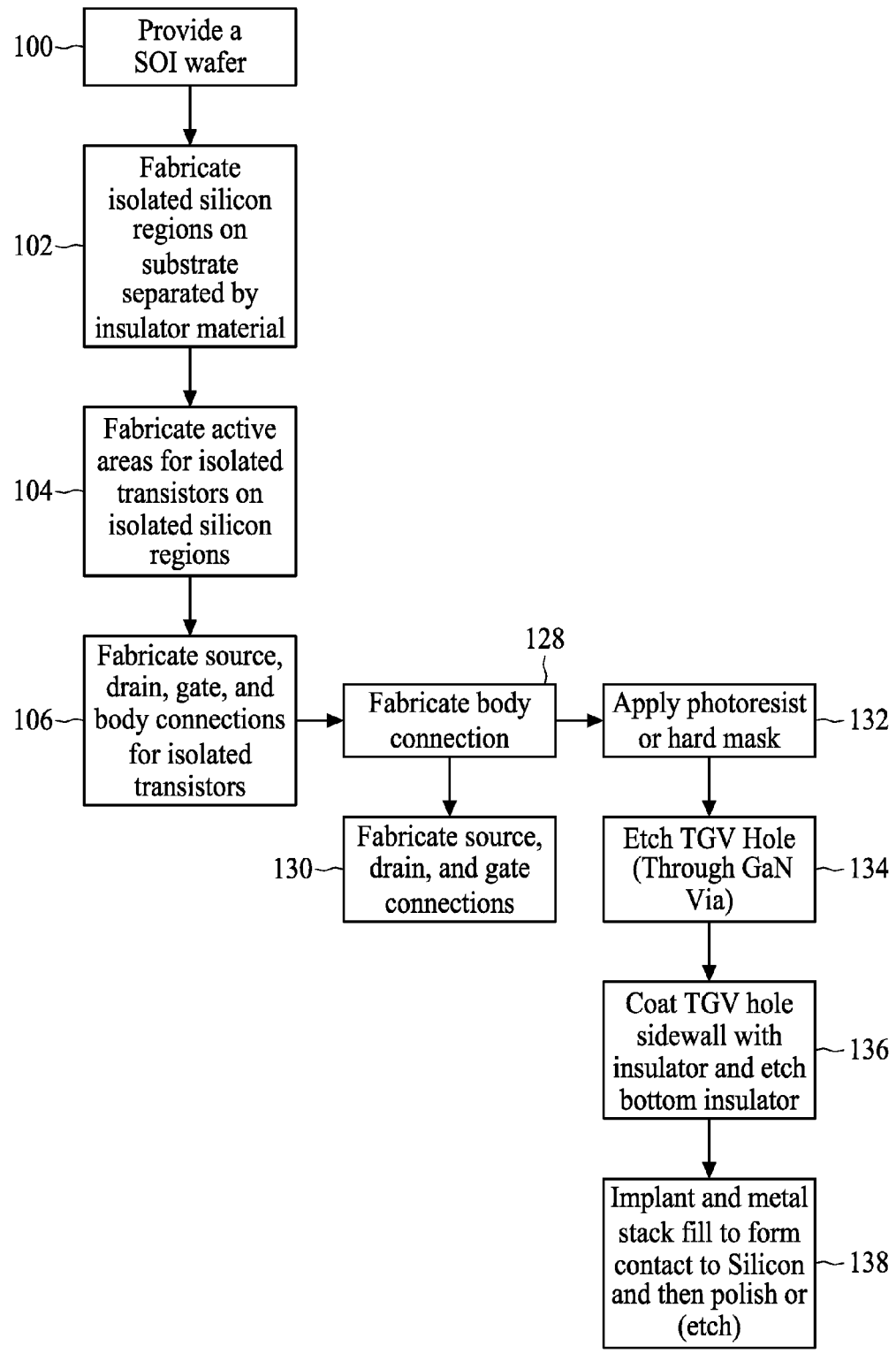
FIG. 9 is another process flow chart illustrating an example method of fabricating a semiconductor device that achieves isolation of GaN/Si transistors, in accordance with some embodiments.
Figure 10A:
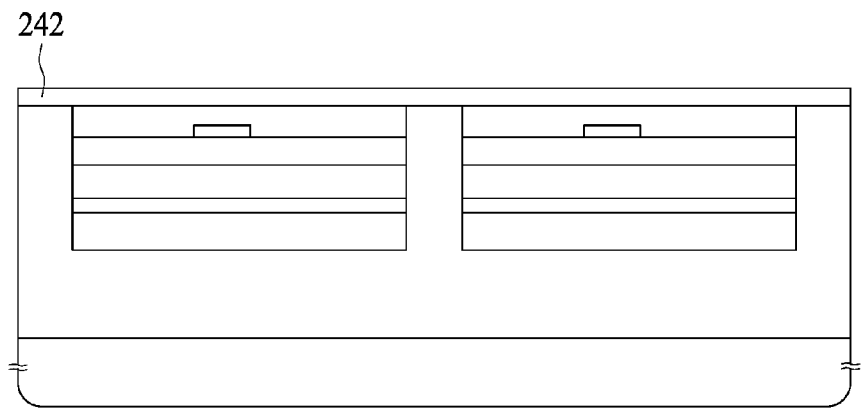
FIGS. 10A, 10B, 10C, and 10D provide cross-sectional views of an example semiconductor device during various stages of fabrication according to operations specified in FIG. 9, in accordance with some embodiments.

FIG. 9 is another process flow chart illustrating an example method of fabricating a semiconductor device that achieves isolation of GaN/Si transistors. This example method includes similar operations as the example method of FIG. 2 and further illustrates operations for fabricating a transistor body connection point. A mask such as photoresist or a hard mask may be applied above the active areas of the isolated transistors (operation 132). FIG. 10A provides a cross-sectional view of an example SOI wafer with a mask 242 applied above the wafer.

Figure 10B:
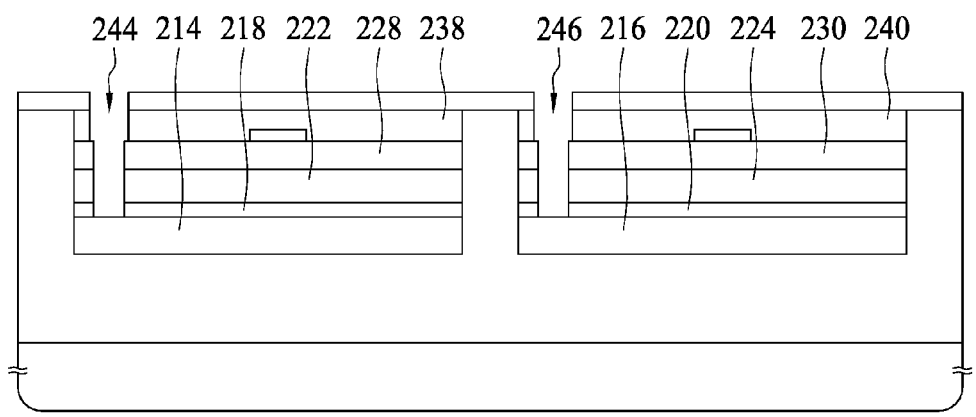

A TGV (Through GaN Via) hole is etched through the mask, passivation layer, AlGaN layer, GaN layer, and transition layer to the silicon layer (operation 134). FIG. 10B provides a cross-sectional view of an example SOI wafer with a TGV hole 244, 246 etched through the mask 242, passivation layer 238, 240, AlGaN layer 228, 230, GaN layer 222, 224, and transition layer 218, 220 to the silicon layer 214, 216.

Figure 10C:
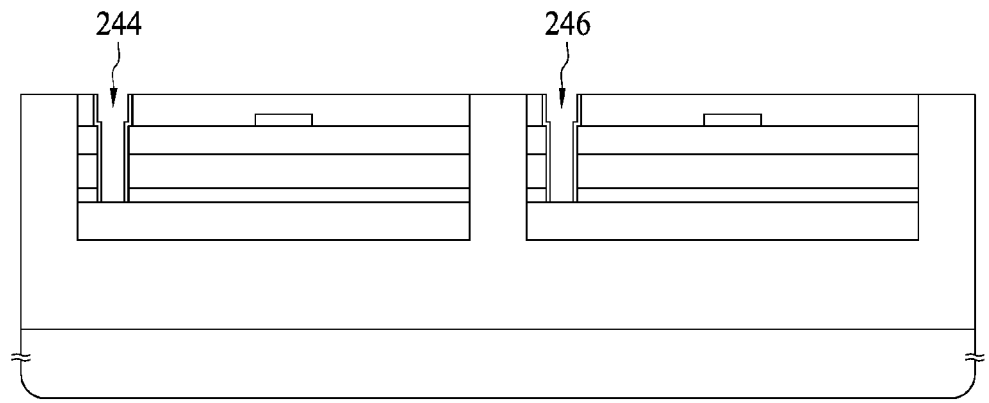

The sidewall of the TGV hole is coated with an insulator and the bottom is etched to remove the insulator from the bottom of the TGV hole (operation 136). FIG. 10C provides a cross-sectional view of an example SOI wafer with the sidewall of the TGV hole 244, 246 coated with an insulator and the bottom etched to remove the insulator from the bottom of the TGV hole 244, 246.

Figure 10D:
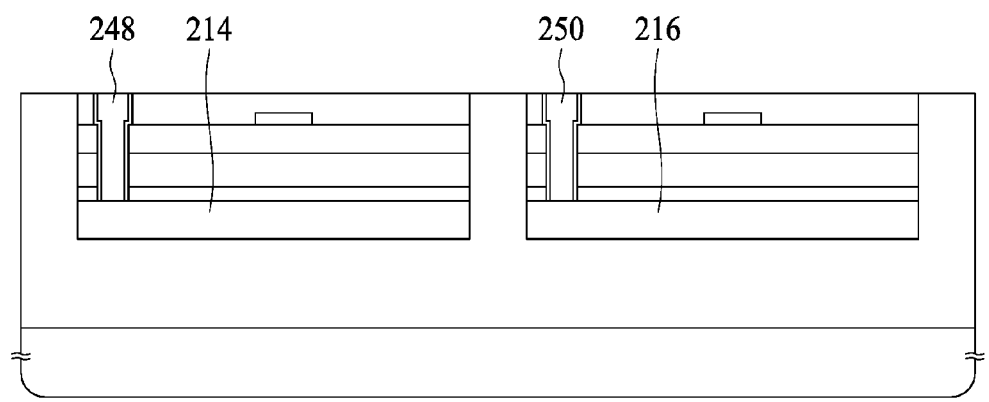

The body contact is formed by implant and metal stack fill to the silicon followed by polishing or (etching) (operation 138). FIG. 10D provides a cross-sectional view of an example SOI wafer with the TGV hole filled with metal 248, 250 to create a contact to the silicon layer 214, 216.

Figure 11:
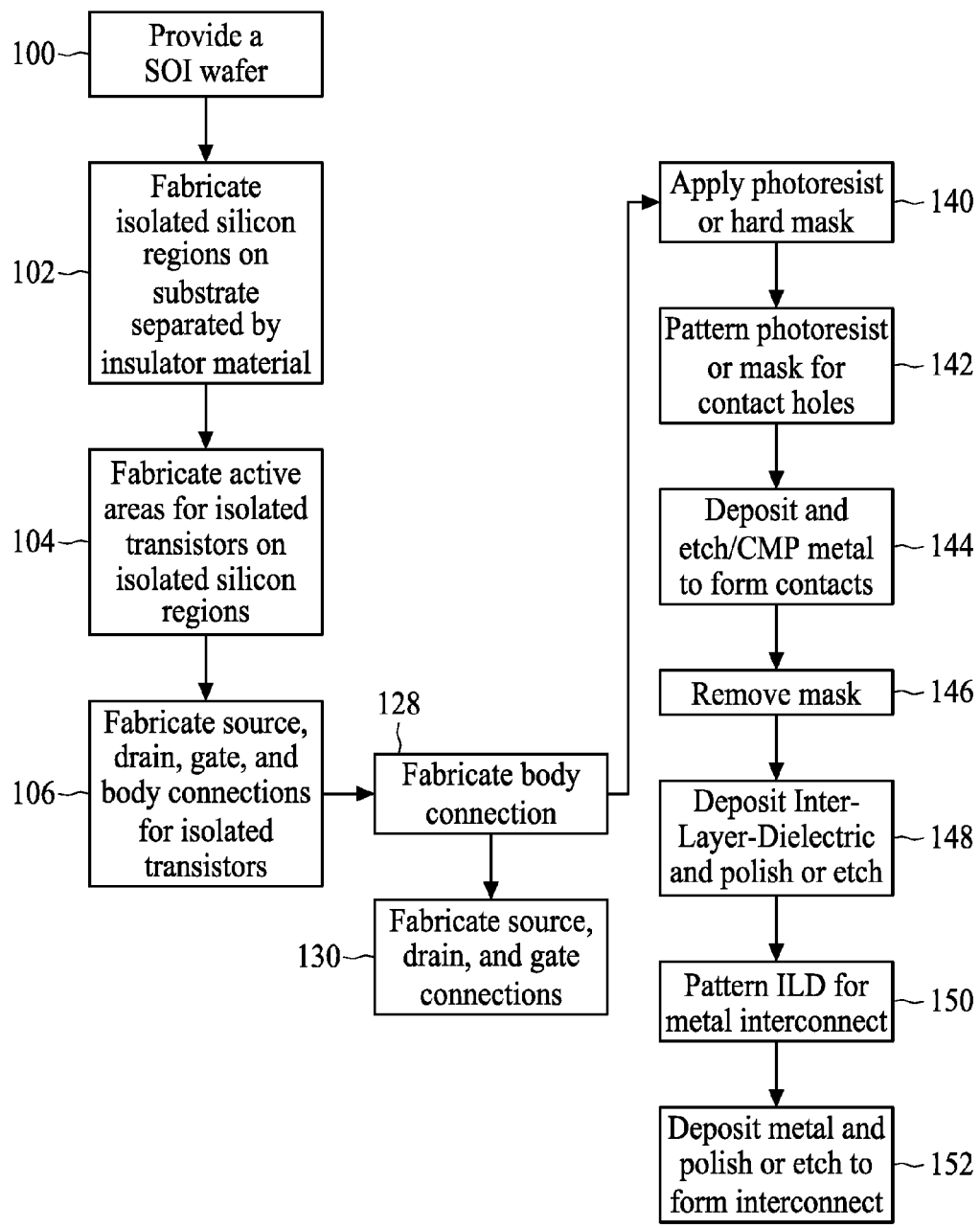
FIG. 11 is another process flow chart illustrating an example method of fabricating a semiconductor device that achieves isolation of GaN/Si transistors, in accordance with some embodiments.
Figure 12A:
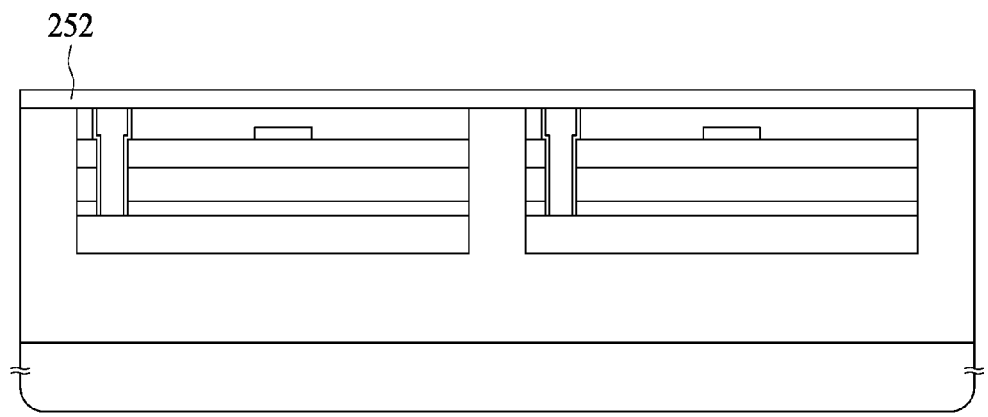
FIGS. 12A, 12B, 12C, 12D, 12E, 12F, and 12G provide cross-sectional views of an example semiconductor device during various stages of fabrication according to operations specified in FIG. 11, in accordance with some embodiments.

FIG. 11 is another process flow chart illustrating an example method of fabricating a semiconductor device that achieves isolation of GaN/Si transistors. This example method includes similar operations as the example method of FIG. 2 and further illustrates operations for fabricating transistor source, drain, and gate connection points. A mask such as photoresist or a hard mask may be applied above the active areas of the isolated transistors (operation 140). FIG. 12A provides a cross-sectional view of an example SOI wafer with a mask 252 applied above the wafer.

Figure 12B:
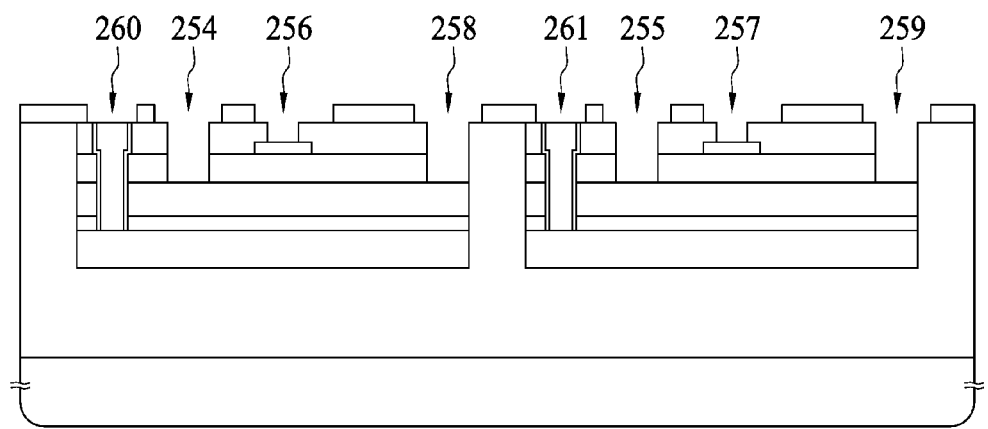

The mask is patterned for contact holes for the source, gate, drain, and body connections (operation 142). FIG. 12B provides a cross-sectional view of an example SOI wafer with the mask patterned for contact holes 254-261 for the source, gate, drain, and body connections.

Figure 12C:
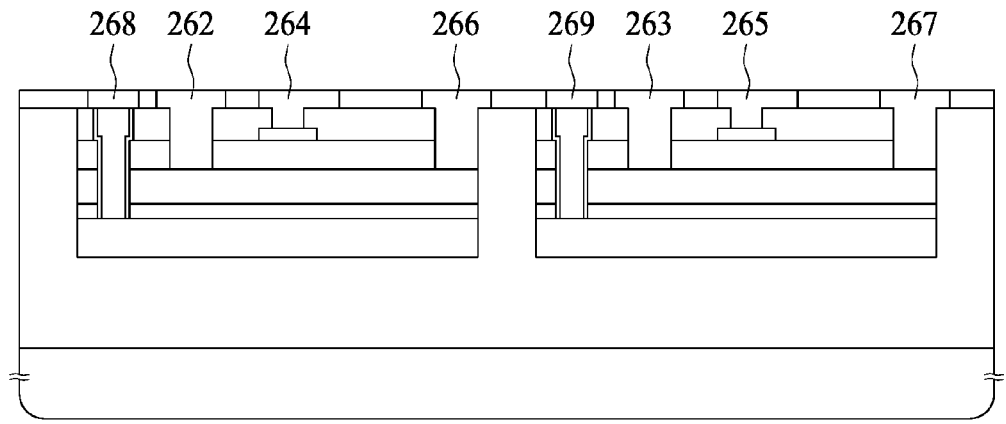

The contact holes are filled with metal, for example using depositing, etching, chemical mechanical polishing (CMP) operations, to form metal contacts for the source, gate, drain, and body connections (operation 144). FIG. 12C provides a cross-sectional view of an example SOI wafer with the contact holes filled with metal to form metal contacts for the source (262, 263), gate (264, 265), drain (266, 267), and body (268, 269) connections.

Figure 12D:
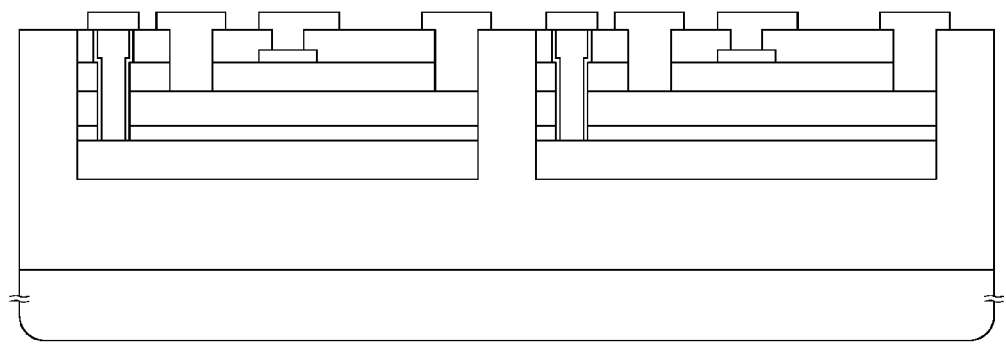

The mask is removed (operation 146). FIG. 12D provides a cross-sectional view of an example SOI wafer with the mask removed.

Figure 12E:
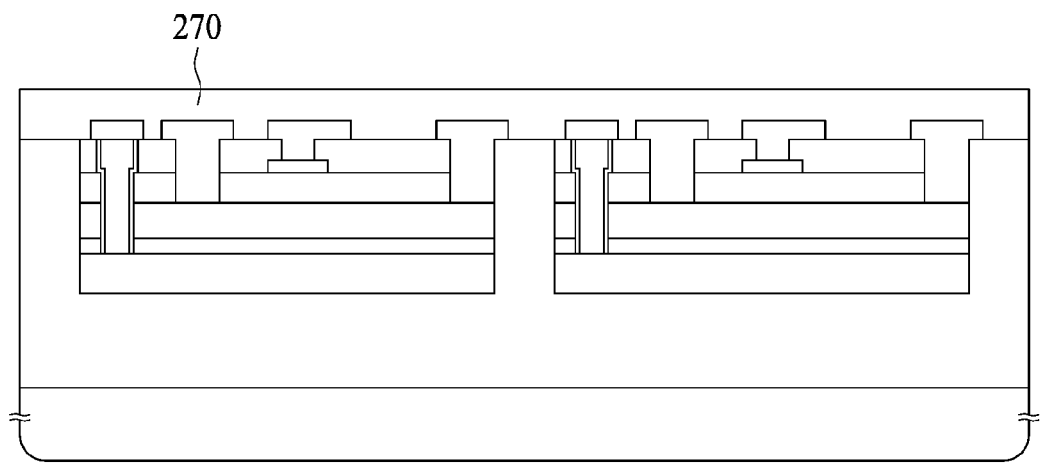

Inter-layer-dielectric (ILD) is applied above the transistors. FIG. 12E provides a cross-sectional view of an example SOI wafer with inter-layer-dielectric (ILD) 270 applied above the transistors.

Figure 12F:
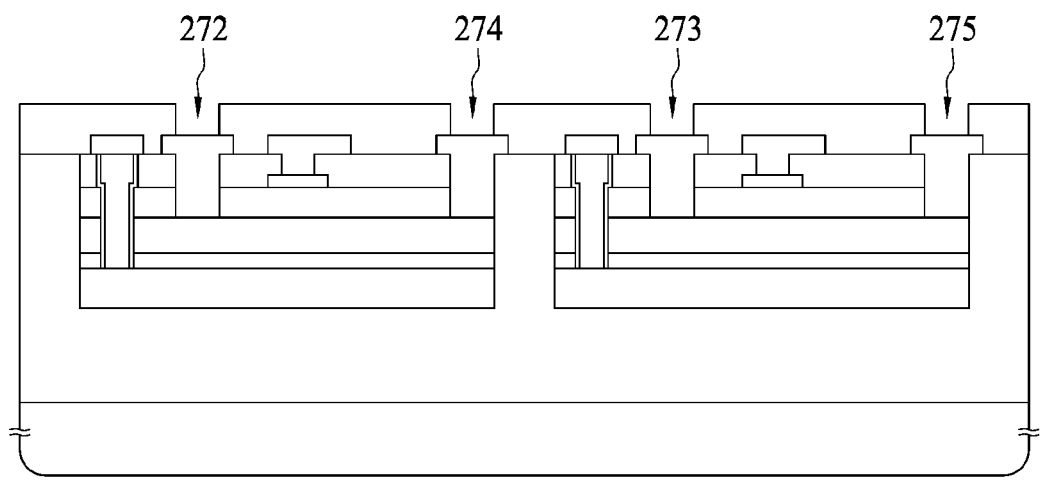

The ILD is patterned with holes for metal interconnects for the source and drain contacts (operation 150). FIG. 12F provides a cross-sectional view of an example SOI wafer with the ILD 270 patterned with holes 272-275 for metal interconnects for the source and drain contacts.

Figure 12G:
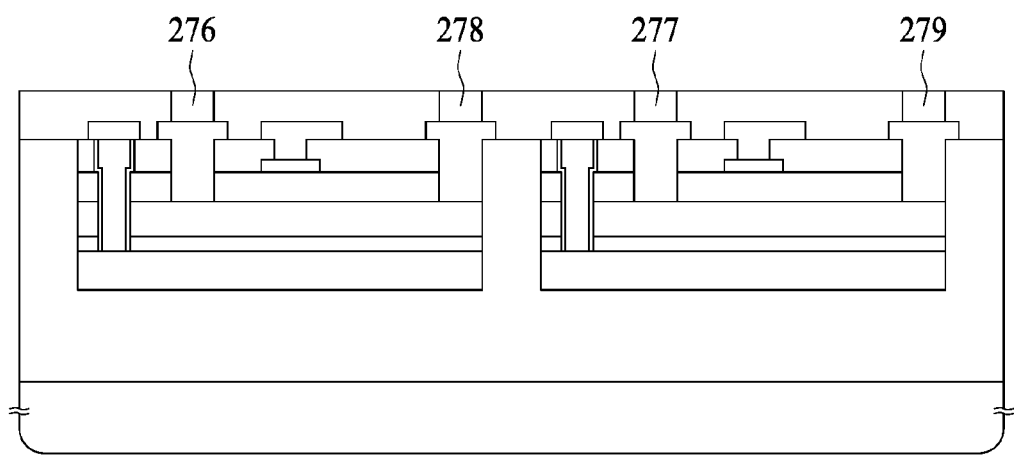

The holes for the metal interconnects for the source and drain contacts are filled with metal and the metal is polished or etched to form the interconnects (operation 152). FIG. 12G provides a cross-sectional view of an example SOI wafer with the holes for the metal interconnects for the source and drain contacts filled with metal and the metal polished or etched to form the source interconnects (276, 277) and the drain interconnects (278, 279).

The example methods and semiconductor structures provide an integrated circuit substrate isolation scheme that results in the isolation of GaN/Si transistors. The resulting integrated circuit substrate isolation scheme may eliminate GaN/Si substrate coupling problems that degrade performance or disrupt the functionality of GaN/Si circuits in different power domains or GaN/Si transistors with significantly large body bias (Vb).

In one embodiment, a method of fabricating a semiconductor device having an isolated first transistor circuit and an isolated second transistor circuit is disclosed. The method comprises providing a silicon on insulator (SOI) wafer and fabricating an isolated first silicon region and an isolated second silicon region on the SOI wafer wherein each of the first silicon region and the second silicon region is bounded on its sides by a trench filled with insulator material. The method further comprises fabricating an active area comprising GaN on each of the first silicon region and the second silicon region to form the first transistor circuit and the second transistor circuit and fabricating source, drain, gate, and body connections for each of the first transistor circuit and the second transistor circuit.

These aspects and other embodiments may include one or more of the following features. Fabricating an isolated first silicon region and an isolated second silicon region on the SOI wafer may comprise applying a mask to the silicon layer above the insulator on the SOI wafer, etching the mask and silicon layer to an etch stop at the insulator to form a silicon trench, filling the trench with insulator material, and removing the mask. Fabricating an active area comprising GaN on each of the first silicon region and the second silicon region may comprise fabricating through epitaxial growth a GaN layer on each of the first silicon region and the second silicon region, fabricating through epitaxial growth an AlGaN layer on each of the GaN layers, fabricating through epitaxial growth a polarization modulation layer above each of the AlGaN layers, patterning the polarization modulation layers, and fabricating through deposition and polishing a passivation layer above each of the first silicon region and the second silicon region.

Fabricating source, drain, gate, and body connections for each of the first transistor circuit and the second transistor circuit may comprise fabricating the body connection for each of the first transistor circuit and the second transistor circuit and fabricating the source, drain, and gate connection for each of the first transistor circuit and the second transistor circuit after fabricating the body connection.

Fabricating the body connection for each of the first transistor circuit and the second transistor circuit may comprise applying a mask above the wafer, etching a via hole through the active area of each of the first transistor circuit and the second transistor circuit to the silicon layer above the insulator, coating the via hole sidewall with insulator material, and implanting metal material into the via hole in each of the first transistor circuit and the second transistor circuit to form a contact to the silicon in each of the first transistor circuit and the second transistor circuit.

Fabricating the source, drain, and gate connections for each of the first transistor circuit and the second transistor circuit may comprise applying a mask above the wafer, patterning the mask for contact holes, depositing metal material to form contacts for the source, drain, and gate connections for each of the first transistor circuit and the second transistor circuit, and removing the mask. Fabricating the source, drain, and gate connections for each of the first transistor circuit and the second transistor circuit may further comprise depositing inter-layer-dielectric (ILD) material above the wafer, patterning the ILD material for metal interconnects, and depositing metal and polishing the metal to form interconnects. Fabricating an active area comprising GaN on each of the first silicon region and the second silicon region may comprise fabricating through epitaxial growth a GaN layer on each of the first silicon region and the second silicon region, fabricating through epitaxial growth an AlGaN layer on each of the GaN layers, fabricating through epitaxial growth a polarization modulation layer above each of the AlGaN layers, patterning the polarization modulation layers, and fabricating through deposition and polishing a passivation layer above each of the first silicon region and the second silicon region.

In another embodiment, a method of fabricating GaN transistors on a silicon on insulator (SOI) wafer with a GaN transistor in a first transistor circuit having its substrate isolated from the substrate of a transistor in a second transistor circuit is provided. The method comprises fabricating an isolated first silicon region and an isolated second silicon region on a SOI wafer wherein each of the first silicon region and the second silicon region is bounded on its sides by a trench filled with insulator material. The method further comprises fabricating an active area on each of the first silicon region and the second silicon region through epitaxial growth operations to form the first transistor circuit and the second transistor circuit wherein the active area of the first silicon region comprises a GaN layer. The method additionally comprises fabricating source, drain, gate, and body connections for each of the first transistor circuit and the second transistor circuit.

These aspects and other embodiments may include one or more of the following features. Fabricating an isolated first silicon region and an isolated second silicon region on the SOI wafer may comprise applying a mask to the silicon layer above the insulator on the SOI wafer, etching the mask and silicon layer to an etch stop at the insulator to form a silicon trench, filling the trench with insulator material, and removing the mask.

Fabricating an active area comprising GaN may comprise fabricating through epitaxial growth a GaN layer on each of the first silicon region and the second silicon region, fabricating through epitaxial growth an AlGaN layer on each of the GaN layers, fabricating through epitaxial growth a polarization modulation layer above each of the AlGaN layers, patterning the polarization modulation layers, and fabricating through deposition and polishing a passivation layer above each of the first silicon region and the second silicon region.

Fabricating the body connection for each of the first transistor circuit and the second transistor circuit may comprise applying a mask above the wafer, etching a via hole through the active area of each of the first transistor circuit and the second transistor circuit to the silicon layer above the insulator, coating the via hole sidewall with insulator material, and implanting metal material into the via hole in each of the first transistor circuit and the second transistor circuit to form a contact to the silicon in each of the first transistor circuit and the second transistor circuit.

In another embodiment, a semiconductor device fabricated on a silicon on insulator (SOI) wafer is provided. The device comprises a first transistor circuit fabricated on an isolated first silicon region and a second transistor circuit fabricated on an isolated second silicon region wherein each of the first transistor circuit and the second transistor circuit has an active region comprising GaN material above its respective isolated silicon region and wherein each of the isolated silicon regions is formed from the silicon above the insulator on the SOI wafer. The device further comprises a trench filled with an insulator that bounds the sides of the isolated silicon regions, the sides of the active region of the first transistor circuit, and the sides of the active region of the second transistor circuit wherein the first silicon region and the first transistor circuit are isolated from the second silicon region and the second transistor circuit by the insulator material. The device additionally comprises a body contact connection point for each of the first transistor circuit and the second transistor circuit.

These aspects and other embodiments may include one or more of the following features. The active regions of each of the first transistor circuit and the second transistor circuit may comprise a silicon layer, a transition layer above the silicon layer, a GaN layer above the transition layer, and an AlGaN layer above the GaN layer. The GaN layer of each of the first transistor circuit and the second transistor circuit may have been grown through epitaxial growth operations on the first and second silicon regions, the AlGaN layer may have been grown through epitaxial growth operations on the GaN layer, a polarization modulation layer may have been fabricated on the AlGaN layer through epitaxial growth operations on the AlGaN layer and patterning operations, and a passivation layer above each of the first silicon region and the second silicon region may have been fabricated through deposition and polishing operations. The isolated first silicon region and the isolated second silicon region may have been formed through a mask being applied above the silicon on the SOI wafer, the mask and a portion of the silicon being etched to an etch stop at the insulator of the SOI wafer to form a silicon trench, the trench being filled with insulator material, and the mask being removed. Each of the body contact connection points may comprise a through-GaN-via (TGV) hole in the active region of the respective transistor circuit to the respective isolated silicon region that is filled with metal material forming a contact to the respective isolated silicon region. The body contact connection points may have been formed through a mask being applied above the wafer, the TGV hole being etched through the active area to the silicon layer above the insulator, the TGV sidewall being coated with insulator material, and metal material being implanted into the TGV hole.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device having an isolated first transistor circuit and an isolated second transistor circuit, the method comprising:
   providing a silicon on insulator (SOI) wafer comprising an insulator layer and a silicon layer disposed over the insulator layer;
   applying a first mask to the silicon layer;
   etching the first mask and the silicon layer to an etch stop at the insulator to form an isolated first silicon region and an isolated second silicon region each disposed over the insulator layer, the isolated first and second silicon regions being separated from one another by a trench;
   filling the trench with insulator material so as to bound each of the first silicon region and the second silicon region on its respective sides by the insulator material;
   after filling the trench, removing the first mask to define a first cavity over the isolated first silicon region and a second cavity over the isolated second silicon region;
   after removing the first mask, fabricating a first active area comprising gallium nitride (GaN) within the first cavity over the isolated first silicon region and a second active area comprising GaN within the second cavity over the isolated second silicon region to respectively form the first transistor circuit and the second transistor circuit; and
   fabricating source, drain, gate, and body connections for each of the first transistor circuit and the second transistor circuit.

2. The method of claim 1 wherein fabricating the first active area comprises fabricating through epitaxial growth a first GaN layer on the isolated first silicon region and fabricating through epitaxial growth a first aluminum gallium nitride (AlGaN) layer on the first GaN layer; and
   wherein fabricating the second active area comprises fabricating through epitaxial growth a second GaN layer on the isolated second silicon region and fabricating through epitaxial growth a second AlGaN layer on the second GaN layer.

3. The method of claim 1 wherein the fabricating source, drain, gate, and body connections for each of the first transistor circuit and the second transistor circuit comprises:
   fabricating the body connection for each of the first transistor circuit and the second transistor circuit; and
   fabricating the source, drain, and gate connection for each of the first transistor circuit and the second transistor circuit after fabricating the body connection.

4. The method of claim 1 wherein fabricating the body connection for each of the first transistor circuit and the second transistor circuit comprises:
   applying a second mask above the wafer;
   etching a first via hole through the second mask and the first active area of the first transistor circuit to the isolated first silicon region, the first via hole having a first sidewall;
   etching a second via hole through the second mask and the second active area of the second transistor circuit to the isolated second silicon region, the second via hole having a second sidewall;
   respectively coating the first and second sidewalls with insulator material; and
   after the coating, implanting metal material into each of the first and second via holes to form a respective contact to the isolated first and second silicon regions.

5. The method of claim 1 wherein fabricating the source, drain, and gate connections for each of the first transistor circuit and the second transistor circuit comprises:
   applying a second mask above the wafer;
   patterning the second mask for contact holes;
   depositing metal material into the contact holes to form contacts for the source, drain, and gate connections for each of the first transistor circuit and the second transistor circuit; and
   removing the second mask.

6. The method of claim 5 further comprising:
   depositing inter-layer-dielectric (ILD) material above the wafer;
   patterning the ILD material for metal interconnects;
   depositing metal and polishing to form interconnects.

7. The method of claim 1, further comprising
   fabricating through deposition and polishing a passivation layer above each of the isolated first silicon region and the isolated second silicon region.

8. The method of claim 7 wherein fabricating the body connection for each of the first transistor circuit and the second transistor circuit comprises:
   applying a second mask above the wafer;
   etching a first via hole through the second mask and the first active area of the first transistor circuit to the isolated first silicon region, the first via hole having a first sidewall;
   etching a second via hole through the second mask and the second active area of the second transistor circuit to the isolated second silicon region, the second via hole having a second sidewall;
   respectively coating the first and second sidewalls with insulator material; and
   after the coating, implanting metal material into each of the first and second via holes to form a respective contact to the isolated first and second silicon regions.

9. The method of claim 8 wherein fabricating the source, drain, and gate connections for each of the first transistor circuit and the second transistor circuit comprises:
   applying a third mask above the wafer;
   patterning the third mask for contact holes;
   depositing metal material into the contact holes to form contacts for the source, drain, and gate connections for each of the first transistor circuit and the second transistor circuit; and
   removing the third mask.

10. A method of fabricating gallium nitride (GaN) transistors on a silicon on insulator (SOI) wafer with a GaN transistor in a first transistor circuit having its substrate isolated from the substrate of a transistor in a second transistor circuit, the method comprising:
    fabricating an isolated first silicon region and an isolated second silicon region on a SOI wafer comprising an insulator layer and a silicon layer disposed over the insulator layer, each of the first silicon region and the second silicon region bounded on its sides by a trench filled with insulator material so as to define a first cavity over the isolated first silicon region and a second cavity over the isolated second silicon region;

fabricating a first active area within the first cavity over the isolated first silicon region and fabricating a second active area within the second cavity over the isolated second silicon region through epitaxial growth operations to respectively form the first transistor circuit and the second transistor circuit, the first active area comprising a first GaN layer; and fabricating source, drain, gate, and body connections for each of the first transistor circuit and the second transistor circuit.

11. The method of claim 10 wherein fabricating the isolated first silicon region and an isolated second silicon region on the SOI wafer comprises:

applying a mask to the silicon layer;

etching the mask and the silicon layer to an etch stop at the insulator layer to form a trench in the silicon layer separating the isolated first and second silicon regions from one another;

filling the trench with insulator material; and removing the mask to define the first cavity and the second cavity.

12. The method of claim 10 wherein fabricating the first active area comprises fabricating through epitaxial growth a first GaN layer on the isolated first silicon region and fabricating through epitaxial growth a first aluminum gallium nitride (AlGaN) layer on the first GaN layer; and wherein fabricating the second active area comprises fabricating through epitaxial growth a second GaN layer on the isolated second silicon region and fabricating through epitaxial growth a second AlGaN layer on the second GaN layer.

13. The method of claim 10 wherein fabricating the body connection for each of the first transistor circuit and the second transistor circuit comprises:

applying a mask above the wafer;

etching a first via hole through the mask and the first active area of the first transistor circuit to the isolated first silicon region, the first via hole having a first sidewall;

etching a second via hole through the mask and the second active area of the second transistor circuit to the isolated second silicon region, the second via hole having a second sidewall;

respectively coating the first and second sidewalls with insulator material; and after the coating, implanting metal material into the each of the first and second via holes to form a respective contact to the isolated first and second silicon regions.

14. A method of fabricating a semiconductor device on a silicon on insulator (SOI) wafer comprising a silicon layer and an insulator layer, the method comprising:

fabricating an isolated first silicon region and an isolated second silicon region, the first and second isolated silicon regions each formed from the silicon layer and separated from one another by a trench above the insulator layer;

filling the trench with an insulator that bounds respective sides of the isolated first and second silicon regions such that the first silicon region is isolated from the second silicon region by the insulator material and a cavity respectively is disposed over each of the first and second silicon regions;

after filling the trench, respectively fabricating first and second active regions comprising first and second GaN layers within the cavities to form the first transistor circuit and the second transistor circuit to form the first transistor circuit and the second transistor circuit; and providing a respective body contact connection point for each of the first transistor circuit and the second transistor circuit.

15. The method of claim 14 wherein respectively fabricating the active regions comprises respectively fabricating, within the cavities, a transition layer, a GaN layer above the transition layer, and an aluminum gallium nitride (AlGaN) layer above the GaN layer.

16. The method of claim 15 wherein the GaN layer is fabricated through epitaxial growth operations on the transition layer; and wherein the AlGaN layer is fabricated through epitaxial growth operations on the GaN layer.

17. The method of claim 14 wherein the isolated first silicon region and the isolated second silicon region are fabricated using steps comprising:

applying a mask above the silicon layer;

etching the mask and a portion of the silicon layer to an etch stop at the insulator layer to form the trench;

filling the trench with insulator material; and removing the mask to form the cavities.

18. The method of claim 14 wherein providing the respective body contact connection point for each of the first transistor circuit and the second transistor circuit comprises:

providing a through-GaN-via (TGV) hole in the active region of the respective transistor circuit to the respective isolated silicon region that is filled with metal material forming a contact to the respective isolated silicon region.

19. The method of claim 18 further comprising forming the respective body contact connection points through:

applying a mask above the wafer;

etching the TGV hole through the active area to the silicon layer above the insulator;

coating the TGV sidewall with insulator material; and implanting metal material into the TGV hole.

* * * * *